United States Patent [19]

Kato et al.

[11] Patent Number: 5,763,072
[45] Date of Patent: Jun. 9, 1998

[54] CERAMIC SLIDING MEMBER HAVING PYROLYTIC CARBON FILM AND PROCESS OF FABRICATING THE SAME

[75] Inventors: Etsuro Kato, Aichi-ken; Itsuki Yamamoto; Chunting Li, both of Seto; Koji Maruyama, Kani, all of Japan

[73] Assignee: Maruwa Ceramic Co., Ltd., Japan

[21] Appl. No.: 576,135

[22] Filed: Dec. 21, 1995

[30] Foreign Application Priority Data

Dec. 23, 1994 [JP] Japan ................................ 6-340880

[51] Int. Cl.$^6$ ............................................. F16K 3/02
[52] U.S. Cl. .......................... 428/336; 428/408; 428/426; 428/446; 428/698; 428/701; 428/702
[58] Field of Search ........................ 428/408, 698, 428/701, 702, 336, 446, 426

[56] References Cited

U.S. PATENT DOCUMENTS

| 4,647,494 | 3/1987 | Meyerson et al. ............ 428/408 |
| 4,991,822 | 2/1991 | Enke ............................ 251/368 |

FOREIGN PATENT DOCUMENTS

| 216 810 | 4/1987 | European Pat. Off. . |
| 03 172 683 | 7/1991 | Japan . |
| 04 041 590 | 2/1992 | Japan . |

OTHER PUBLICATIONS

Powell, Caroll F. et al.: "Vapor Deposition" 1966, John Wiley and Sons, New York, XP002024878, pp. 352–359.

*Primary Examiner*—Archene Turner
*Attorney, Agent, or Firm*—Parkhurst & Wendel, L.L.P

[57] ABSTRACT

Ceramic sliding member including (a) a ceramic substrate consisting of a dense sintered body of a ceramic material consisting essentially of metal oxide and/or silicate, (b) an intermediate film formed on a mechanically ground surface of the ceramic substrate, the intermediate film being formed from a product produced by pyrolysis of an organosilicon compound and comprising carbon and silicon, and (c) a pyrolytic carbon film formed on the intermediate film, the pyrolytic carbon film being produced by pyrolysis of hydrocarbon and having a graphite-like layered structure, the pyrolytic carbon film serving as a sliding surface of the ceramic sliding member.

4 Claims, 4 Drawing Sheets

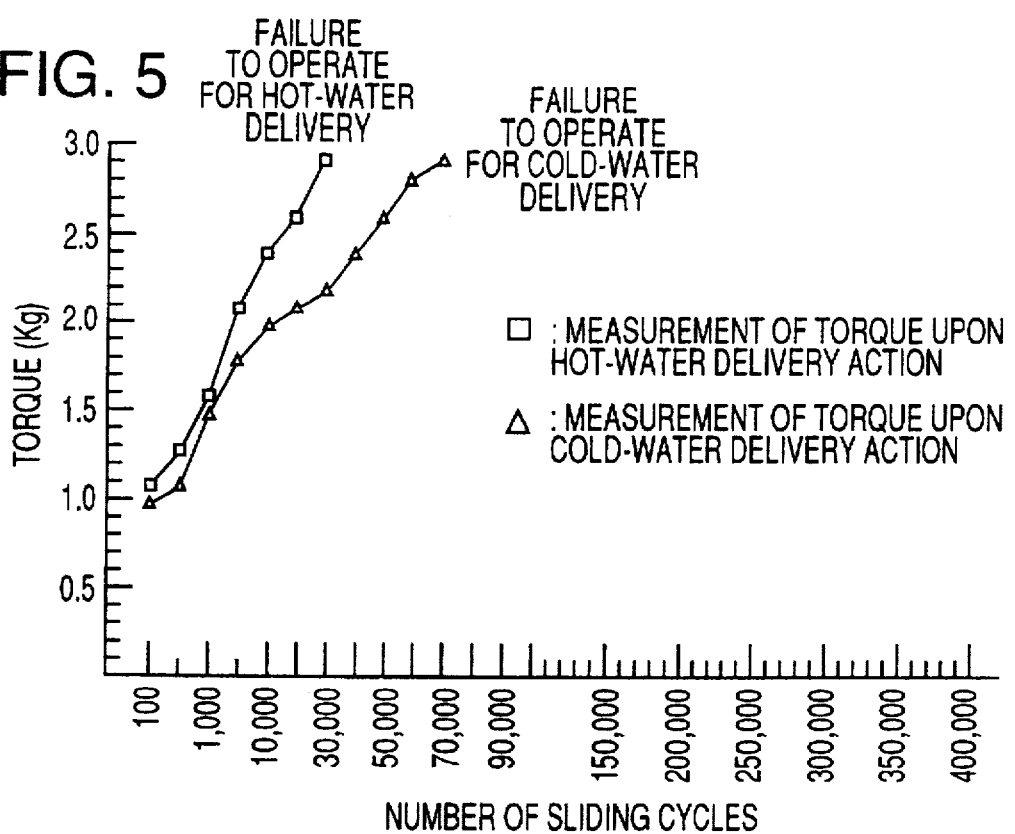
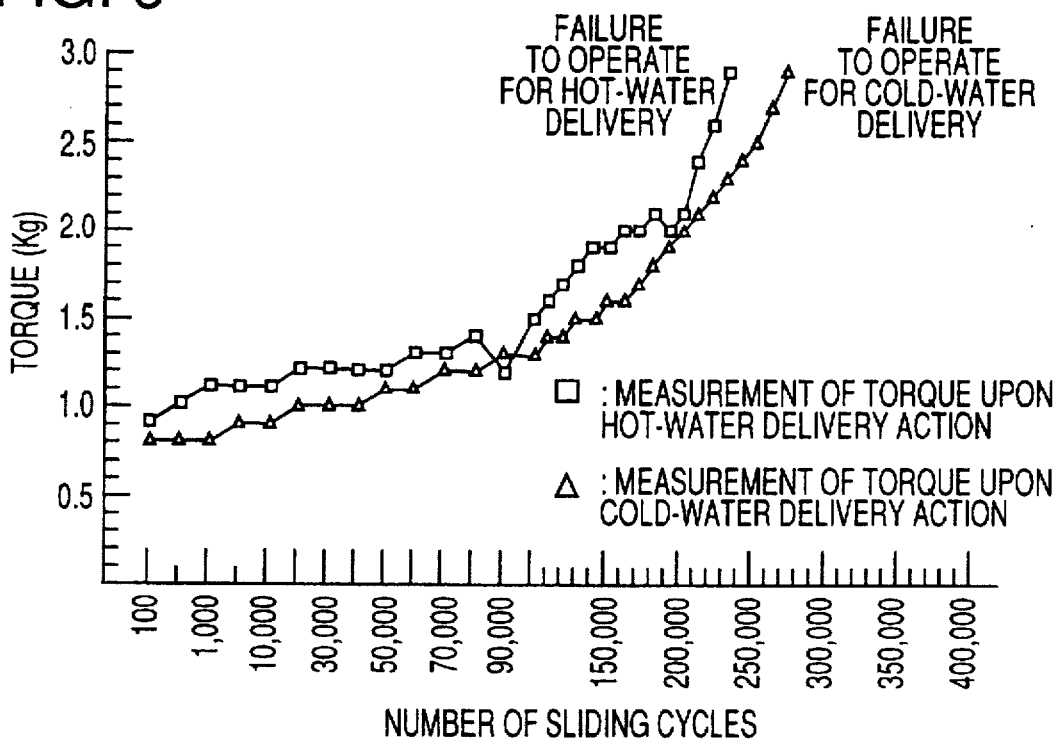

CERAMIC SLIDING MEMBER HAVING PYROLYTIC CARBON FILM AND PROCESS OF FABRICATING THE SAME

BACKGROUND OF THE INVENTION

1. Field of the Invention

The present invention relates to a highly durable sliding member made of a ceramic material, and a process of fabricating such ceramic sliding member.

2. Description of the Prior Art

Ceramics, which are generally excellent in wear resistance, heat resistance and corrosion resistance, have been widely employed as a material for various members which slidably move on other members. A typical application of ceramic materials for such sliding members is found in the manufacture of bibcocks or water faucets. A sliding member made of most common oxide ceramics such as alumina, mullite, silica and glass is usually coated at its sliding surface with an oily lubricant such as a grease, for assuring a high degree of slidability with respect to the surface of the other member. During use of the sliding members, the lubricant is gradually removed from the sliding surface, with a result of an increase in its sliding resistance. Thus, such a sliding member coated with a lubricant suffers from relatively short life expectancy or low durability.

In view of this drawback of such a sliding member, there have been proposed various non-lubricated sliding members which do not use any grease or other oily lubricant. For instance, JP-A-63-9781 discloses a sliding member of a porous ceramic structure filled with carbon fluoride, carbon or boron nitride, and JP-U-63-51970, JP-U-63-180776 and JP-U-2-136036 disclose a sliding member having a sliding surface coated with a layer of fluorocarbon resin, molybdenum disulfide, graphite, TiN or SiC. Further, JP-A-3-223190 and JP-A-4-165170 show a sliding member having a sliding surface coated with a film of amorphous diamond or diamond-like carbon (DLC).

However, the sliding members disclosed in the above-identified publications suffer from the following problems:

The sliding member having a porous ceramic structure tends to cause leakage of a fluid when used as a water faucet, for example, and is not satisfactory in mechanical strength and wear resistance. The sliding member whose sliding surface is partly constituted by a solid material having a lubricating property does not have a sufficiently reduced sliding resistance in the absence of a grease. While the sliding members having a coating layer of a non-oxide hard wear-resistant material such as TiN or SiC or a coating film of a special wear-resistant high-hardness material such as amorphous diamond or DLC exhibit comparatively excellent sliding characteristics, the manufacture of these sliding members requires sophisticated techniques such as a plasma process (chemical vapor deposition) or an ion beam process (physical vapor deposition), and tends to be complicated and costly, leading to low commercial availability of these sliding members.

The prior art technologies which have been discussed above may be roughly classified into the following two categories: That is, the first of these categories uses an oxide ceramic material as a hard wear-resistant base member or substrate, and a solid lubricating substance or material which constitutes a part of the surface of the base member or substrate, so as to provide a sliding surface whose sliding resistance is considerably small. This type of sliding member according to the technology in this first category is shown in enlargement in an elevational view of FIG. 1, which is taken in cross section in a plane perpendicular to a sliding surface 1 of the sliding member. As shown in FIG. 1, ceramic crystal grains 2 consisting of wear-resistant oxide and/or silicate are exposed on the sliding surface 1, together with a lubricant 4. The surface structure of the sliding member also comprises grain boundary bonding portions 3, which may or may not be exposed to the sliding surface 1. According to the prior art technology in the second category, a thin film consisting of a hard wear-resistant material such as silicon carbide, amorphous diamond or diamond-like carbon (DLC) is formed on the surface of a ceramic substrate, as a sliding surface which exhibits high wear resistance and low sliding resistance. This type of sliding member according to the second category is shown in FIG. 2, wherein the thin film of hard wear-resistant material is indicated at 5, while the sliding surface provided by this thin film 5 is indicated generally at 1. The latter type of sliding member as shown in FIG. 2 is better, but is not practically available due to a considerably high cost of manufacture, as explained above.

On the other hand, there are known carbon film resistors using an electrically conductive pyrolytic carbon film, which is fabricated by pyrolysis or thermal decomposition of hydrocarbons at about 1000° C. Since this pyrolytic carbon film can be produced in a large scale at a comparatively low cost on a commercial basis, and has an electrically conductive property, the pyrolytic carbon film has been widely employed as the pyrolytic carbon film resistors. Conventionally, the pyrolytic carbon film is used as a lubricant in the sliding member of the type shown in FIG. 1, utilizing the lubricating property of the pyrolytic carbon. However, the pyrolytic carbon film produced in the known process generally has insufficient hardness and wear resistance, and cannot serve as the thin film sliding surface 1 as shown in FIG. 2, for a long period of time.

SUMMARY OF THE INVENTION

The present invention was developed in the light of the prior art discussed above. Extensive research by the present inventors revealed an appreciable improvement in the wear resistance of the sliding surface provided by an electrically conductive pyrolytic carbon film of a graphite-like layered structure, if this pyrolytic carbon film is formed on an intermediate film formed on a ceramic substrate. It was found that the wear resistance of the pyrolytic carbon film will increase up to a level as high as that of silicon carbide.

It is therefore a first object of the present invention to provide a comparatively inexpensive ceramic sliding member which maintains a sufficiently low sliding resistance for a long time.

It is a second object of this invention to provide a process suitable for economical fabrication of such a ceramic sliding member in a relatively large scale.

The first object may be achieved according to a first aspect of this invention, which provides a ceramic sliding member comprising: (a) a ceramic substrate consisting of a dense sintered body of a ceramic material consisting essentially of metal oxide and/or silicate, the ceramic substrate having a mechanically ground surface; (b) an intermediate film formed on the mechanically ground surface of the ceramic substrate, the intermediate film being formed from a product produced by pyrolysis of an organosilicon compound, and comprising carbon and silicon; and (c) a pyrolytic carbon film formed on the intermediate film, the pyrolytic carbon film being produced by pyrolysis of hydrocarbon and having a graphite-like layered structure, the pyrolytic carbon film serving as a sliding surface of the ceramic sliding member.

In one preferred arrangement of the present invention, the intermediate film comprising carbon and silicon is formed from a product produced by pyrolysis of silicone oil. In another preferred arrangement of the invention, the pyrolytic carbon film is formed with a thickness of 0.1–2.0 µm. In another preferred arrangement, the dense sintered body of the ceramic substrate consists essentially of alumina or zircon.

The second object indicated above may be achieved according to a second aspect of this invention, which provides a process of fabricating a ceramic sliding member having a sliding surface, comprising the steps of: (i) preparing a ceramic substrate consisting of a dense sintered body of a ceramic material consisting essentially of metal oxide and/or silicate, the ceramic substrate having a mechanically ground surface; (ii) effecting pyrolysis of an organosilicon compound on the mechanically ground surface such that the mechanically ground surface is covered by an intermediate film which is formed from a product produced by the pyrolysis and which comprises carbon and silicon; and (iii) effecting pyrolysis of hydrocarbon on the intermediate film such that the intermediate film is covered by a pyrolytic carbon film which is produced by the pyrolysis of the hydrocarbon and which has a graphite-like layered structure, the pyrolytic carbon film serving as a sliding surface of the ceramic sliding member.

In the present process, the pyrolysis of the organosilicon compound is preferably effected at a temperature of 600°–1000° C., and the pyrolysis of the hydrocarbon is preferably effected at a temperature of 950°–1300° C.

In a further preferred form of the present process, the mechanically ground surface of the ceramic substrate is chemically etched before the intermediate film is formed, preferably to a depth of 0.1–1 µm, in particular.

In the present invention as described above, the pyrolytic carbon film having a graphite-like layered structure is formed on the surface of the ceramic substrate, as a coating of a highly wear-resistant material, that is, as the sliding surface of the ceramic sliding member. Thus, substantially no portion of the dense sintered ceramic body consisting essentially of metal oxide and/or silicate is exposed on the sliding surface of the ceramic sliding member. In other words, like the hard wear-resistant thin film 5 as shown in FIG. 2, the pyrolytic carbon film remains covering the surface of the ceramic substrate for a sufficiently long time. While the ceramic sliding member according to the present invention uses the ceramic substrate which consists of a dense sintered body consisting essentially of metal oxide and/or silicate, the sliding resistance and wear resistance of the sliding surface of the sliding member depends primarily on the structural characteristics of the graphite-like layered structure of the pyrolytic carbon film and the adherence or bonding between the pyrolytic carbon film and the ceramic substrate. In the fabricating process according to the present invention, the surface of the ceramic substrate is first mechanically ground, and then the mechanically ground surface is subjected to a treatment by pyrolysis or thermal decomposition of an organosilicon compound, so that the mechanically ground surface is covered by the intermediate film which is formed from a product produced by the pyrolysis and which comprises carbon and silicon. The mechanical grinding and the pyrolytic treatment using the organosilicon compound of the surface of the ceramic substrate cooperate to provide a synergistic effect on the microstructure and the properties of the graphite-like layered film of pyrolytic carbon, so as to dramatically improve the wear resistance of the pyrolytic carbon film which serves as the sliding surface of the ceramic sliding member.

Generally, the surface of a ceramic substrate or base member which serves as the sliding surface of a ceramic sliding member is ground by suitable mechanical grinding means. If a pyrolytic carbon film was directly formed on the mechanically ground surface, the pyrolytic carbon film would tend to be considerably soft and comparatively easily removed or separated from the ground surface of the ceramic substrate. It was found difficult to form a pyrolytic carbon film tightly adherent to the ground surface of the ceramic substrate, under any pyrolyzing conditions in which hydrocarbons are thermally decomposed or pyrolyzed. There has been proposed to improve the adherence or bonding strength between the dense ceramic structure of the ceramic substrate and the pyrolytic carbon film, by a sort of "anchoring effect" provided by a chemical etching treatment of the mechanically ground surface with a solution of a hydrofluoric acid, which gives an infinite number of pin holes or pores formed in the ground surface prior to the production of the pyrolytic carbon film thereon. It was found that the anchoring effect alone would provide substantially no significant increase in the wear resistance of the pyrolytic carbon film. Thus, the pyrolytic carbon film formed on the chemically etched surface of the ceramic substrate is comparatively easily worn out, and the surface of the dense ceramic substrate begins to be exposed in a relatively short time, as in the case of the sliding member of FIG. 1, with a result of some increase in the sliding resistance.

It is an essential feature of the present invention to provide an intermediate film by pyrolysis or thermal decomposition of an organosilicon compound, so that the intermediate film formed on the mechanically ground surface of the ceramic substrate not only provides an appreciable increase in the adherence or bonding between the ceramic substrate and the pyrolytic carbon film, but also has an effect of dramatically changing the nature of the pyrolytic carbon. An experiment conducted by the present inventors revealed an unexpected, substantial improvement in the wear resistance of the pyrolytic carbon film by carrying out a pre-treatment of the mechanically ground surface of the ceramic substrate, more specifically, by heating the ceramic substrate to a temperature of 600°–1000° C., and subjecting the surface of the ceramic substrate to a trace amount of the vapor of an organosilicon compound, so as to coat the subject surface with an intermediate film formed from a product produced by pyrolysis or thermal decomposition of the organosilicon compound, before the pyrolytic carbon film is formed on the thus formed intermediate film. Namely, the intermediate film provided according to the principle of the present invention is effective to enable the pyrolytic carbon film to have a graphite-like layered structure wherein the planes of pyrolytic carbon crystallites are oriented in parallel to each other and to the surface of the ceramic substrate.

In the present invention, the anchoring effect is generally more or less effective to improve the adherence or bonding between the intermediate film formed by pyrolysis of an organosilicon compound and the surface of the ceramic substrate. The anchoring effect is provided by minute holes or pores which remain open on the mechanically ground surface of the ceramic substrate, or minute holes or pores formed by a chemical etching treatment of the mechanically ground surface. However, those holes or pores have a small degree of adverse influence on the orientation of the pyrolytic carbon crystallites formed by pyrolysis of the hydrocarbons. In practice, therefore, a decision as to whether the mechanically ground surface of the ceramic substrate should be chemically treated is made depending upon the material characteristics, microstructure and type of a major crystalline phase of the dense sintered body of metal oxide and/or silicate of the ceramic substrate. It is noted that the chemical etching treatment is not essential in the present invention.

BRIEF DESCRIPTION OF THE DRAWINGS

The above and optional objects, features, advantages and technical significance of this invention will be better understood by reading the following detailed description of a presently preferred embodiment of the invention, when considered in connection with the accompanying drawings, in which:

FIG. 5 is a graph indicating a relationship between the sliding resistance and the number of test sliding cycles of a known alumina sliding member not lubricated with a grease;

FIG. 6 is a graph indicating a relationship corresponding to that of FIG. 5, of a known alumina sliding member lubricated with a grease;

DETAILED DESCRIPTION OF THE PREFERRED EMBODIMENT

Figure 1:
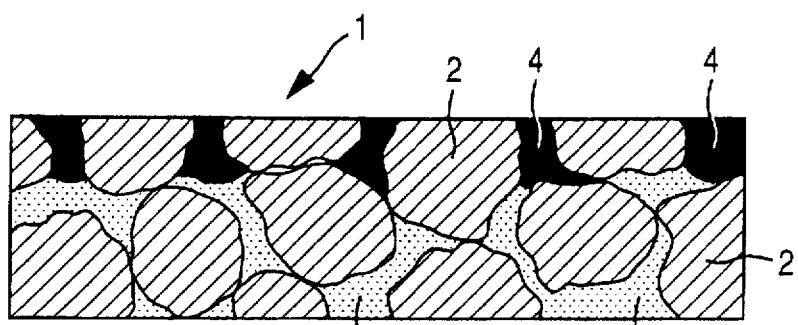
FIG. 1 is an elevational view in cross section schematically showing in enlargement a structure of a surface portion of an example of a sliding member, which surface portion comprises hard wear-resistant ceramic crystal grains and a lubricant.
Figure 2:
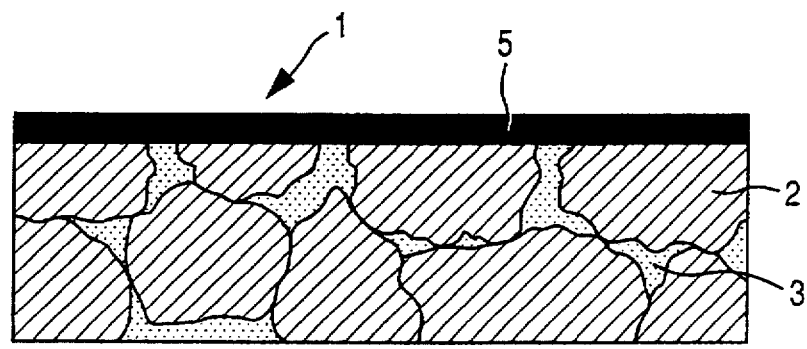
FIG. 2 is an elevational view in cross section schematically showing in enlargement a structure of a surface portion of another example of a sliding member, which surface portion includes a film of a hard wear-resistant material as a sliding surface.
Figure 3:
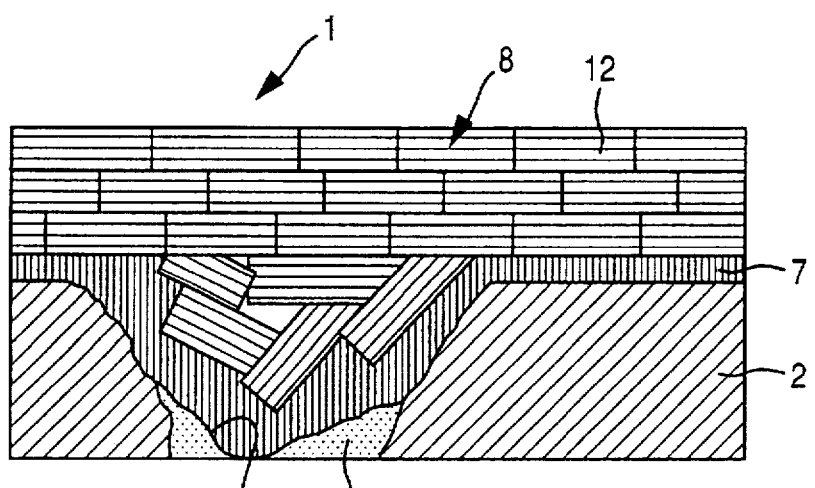
FIG. 3 is an elevational view in cross section schematically showing in enlargement a structure of a surface portion of a ceramic sliding member constructed and fabricated according to one embodiment of the present invention.

For the ceramic substrate or base member of the ceramic sliding member according to the invention, various known ceramic materials consisting essentially of metal oxide and/or silicate may be used and selected, depending upon the desired physical properties or characteristics of the ceramic sliding member. Described more specifically, alumina and zirconia may be preferably used as oxide ceramics, while mullite, zircon and silicate glass may be preferably used as silicate ceramics. To these metal oxide and/or silicate ceramics as a major component, there may be added a small amount of a binder component such as $SiO_2$ or clay. The thus obtained starting ceramic composition is shaped and fired in a known manner to obtain a desired dense sintered body as a ceramic substrate. The thus prepared dense sintered body or ceramic substrate is non-water-absorptive, and desirably has a relative density of at least 90%, preferably at least 95%. The dense sintered body includes ceramic crystal grains 2 bonded together by grain boundary bonding portions 3, as indicated in FIGS. 1 through 3.

A surface of the ceramic substrate consisting of a dense sintered body thus prepared is mechanically ground so as to improve the flatness of the surface, for effectively enhancing the parallel orientation of the pyrolytic carbon crystallites constituting a pyrolytic carbon film, which will be formed in a subsequent process step. Suitable known mechanical grinding means or methods may be used for grinding the surface of the ceramic substrate.

The mechanically ground surface of the ceramic substrate is then chemically etched as needed, so as to give minute pin holes or pores open on the ground surface to such an extent that etching does not adversely affect the parallel orientation of the pyrolytic carbon crystallites. The chemical etching treatment may be effected in a known manner, for example, by exposing the ground surface to an aqueous solution of hydrofluoric acid. The etching depth is generally held within a range of 0.1–1.0 μm. That is, the depth of the holes or pores preferably ranges from 0.1 μm to 1.0 μm.

According to the present invention, the treated surface of the ceramic substrate is coated with a product which is produced by pyrolysis or thermal decomposition of an organosilicon compound and which forms an intermediate film including carbon and silicon. To this end, a suitably selected organosilicon compound is introduced onto the subject surface of the ceramic substrate, while the ceramic substrate is held at an elevated pyrolyzing temperature as explained above, so that the organosilicon compound is thermally decomposed to produce the intermediate film including carbon and silicon. The intermediate film has a thickness generally not larger than 1 μm. The intermediate film, which has Si atoms or Si—O radicals, exhibits a higher degree of affinity to the ceramic composition of the ceramic substrate, than a pyrolytic carbon film consisting of carbon. Accordingly, the intermediate film is effectively prevented from being removed or separated from the surface of the ceramic substrate.

The organosilicon compound should be vaporized for thermal decomposition of the compound in a gas phase. In this respect, the organosilicon compound, which may take the form of a liquid or an oily substance, is selected from a group consisting of: various compounds of polysiloxane (generally called "silicone oil") such as dimethyl polysiloxane and methylphenyl polysiloxane; vinyl triethoxysilane; vinyl trimethoxysilane; epoxysilane; and aminosilane. For pyrolysis of the selected organosilicon compound, the ceramic substrate is placed in a suitable furnace such as an electric furnace, and the organosilicon compound in a liquid phase is introduced into the furnace by a suitable injector such as a syringe while the interior of the furnace is held at a reduced pressure and at a temperature between 600° C. and 1000° C. At the furnace temperature lower than 600° C., substantially no pyrolysis of the introduced organosilicon compound will take place. At the furnace temperature exceeding 1000° C., the pyrolysis is slightly restricted. The optimum pyrolyzing temperature is considered to be in the neighborhood of 900° C. Although the minimum amount of the organosilicon compound required for forming the intermediate film over a unit area of the ceramic substrate surface is not clear, it is essential that the intermediate film be uniformly formed over the entire area of the ceramic substrate surface. An experiment showed that it is sufficient to use the organosilicon compound in an amount which is no less than a half that of the hydrocarbon required for subsequent formation of the pyrolytic carbon film.

In the next step, hydrocarbon is introduced onto the intermediate film thus formed on the surface of the ceramic substrate, for thermal decomposition thereof to form a pyrolytic carbon film. This thermal decomposition or pyrolysis of the hydrocarbon is also effected in an evacuated electric or other furnace at an elevated pyrolyzing temperature, as in the step of forming the intermediate film described above. The hydrocarbon introduced into the furnace may be selected from among benzine, benzene or methane. Each of these hydrocarbon materials provides substantially the same pyrolytic result. Generally, the pyrolyzing temperature for forming the pyrolytic carbon film ranges from 950° C. to 1300° C. At the pyrolyzing temperature lower than 950° C., the pyrolytic carbon film formed is likely to be excessively soft, causing appreciable reduction in the wear resistance of the carbon film as the sliding surface. The pyrolyzing temperature higher than 1300° C. will cause an excessive growth of the carbon crystallites, which may deteriorate the condition of the ground surface of the ceramic substrate, also leading to the undesirable reduction in the wear resistance of the pyrolytic carbon film. Preferably, the pyrolyzing temperature is held within a range of 1000°–1200° C.

The pyrolytic carbon film formed by pyrolysis at a temperature in the neighborhood of 1000° C. is two-dimensionally considered to be graphitic or have a graphite-like layered structure. The "pyrolytic carbon film having a graphite-like layered structure" is interpreted to mean a carbon film having a so-called "turbostratic structure" which does not have a three-dimensional crystal lattice as in graphite and in which the hexagonal carbon ring network planes are randomly stacked, unlike graphite. Thus, the carbon in the pyrolytic carbon film is not purely crystalline, and may even be considered to be amorphous, but may be handled as crystalline in the presence of extremely minute crystallites (having a size of about 50 Angstroms). In the pyrolytic carbon film, the crystallites are completely aligned with each other along the c-axis, but the hexagonal carbon ring network planes are randomly oriented in the plane of the a- and b-axes. Hence, the pyrolytic carbon is considered to be two-dimensionally crystalline. However, the pyrolytic carbon film is basically different from a film of not only diamond but also amorphous diamond or diamond-like carbon (DLC), and a film of any other extremely hard carbon of a cubic crystal system that has the $sp^3$ hybridized orbital. Namely, the pyrolytic carbon is more or less graphitic and has a hexagonal crystal system having the $sp^2$ hybridized orbital, having a certain degree of electrical conductivity, and therefore it is usually treated as soft carbon.

The present inventors conducted an experiment in which a hydrocarbon gas was introduced directly onto the mechanically ground or flat small glassy surface of a dense sintered ceramic body consisting essentially of metal oxide and/or silicate, at a temperature of 950°–1300° C., for thermal decomposition of the hydrocarbon to form a pyrolytic carbon film directly on the surface of the dense sintered ceramic body or substrate, as in the case of FIG. 2. The experiment showed extremely slow formation of carbon nuclei on the surface of the dense sintered ceramic body, and a local growth of carbon with initially deposited local carbon crystallites as the starting nuclei in concentric part-spherical forms, which gradually grow to expand for eventual contact with each other so as to form a wavy film of carbon crystallites. Thus, the pyrolytic carbon film formed is not parallel to the surface of the dense ceramic body or substrate. Although the waviness of the pyrolytic carbon film may be reduced to some extent as the thickness of the film increases, the parallelism of the carbon crystallites is deteriorated as the distance of the crystallites away from the ground surface of the ceramic substrate in the c-axis direction increases. The experiment also revealed further deterioration of the carbon crystallite parallelism in recessed local regions of the ceramic substrate surface which are created by a chemical etching treatment if performed in an attempt to increase the adherence or strength of bonding between the pyrolytic carbon film and the surface of the ceramic substrate. It was found that while the pyrolytic carbon film fabricated in the known manner had a graphite-like layered structure, the wear resistance of the carbon film could not be sufficiently improved.

On the other hand, an X-ray diffraction analysis showed highly parallel orientation of almost all planes of the carbon crystallites (which are perpendicular to the c-axis) with respect to the surface of the ceramic substrate, where the pyrolytic carbon film was formed on an intermediate film which was suitably produced by pyrolysis of an organosilicon compound according to the present invention and which included carbon and silicon. In the presence of silicon in the thin intermediate film produced by pyrolysis of the organosilicon compound, the intermediate film has a significantly increased strength of bonding or adherence to the dense sintered body of a ceramic material consisting essentially of metal oxide and/or silicate, because the silicon in the intermediate film is easily oxidized. In addition, the carbon included in the intermediate film contributes to an appreciable increase in the strength of bonding to the pyrolytic carbon film formed on the intermediate film. Furthermore, the intermediate film is considered to facilitate formation of nuclei of carbon crystallites during pyrolysis of the hydrocarbons, which permits uniform or even deposition of pyrolytic carbon over the entire area of the surface of the ceramic substrate.

While it is considered that the intermediate film which is formed by pyrolysis of the organosilicon compound and which is relatively hard may contribute to an increase in the wear resistance of the pyrolytic carbon film, the wear resistance of the intermediate film per se is not at all sufficient for use as the sliding surface. The present invention, therefore, requires not only the intermediate film which is formed on the mechanically ground surface of the ceramic substrate and which includes carbon and silicon, but also the pyrolytic carbon film which is formed on the intermediate film and which has a graphite-like layered structure. These intermediate and pyrolytic carbon films may be considered to correspond to the hard wear-resistant thin film 5 provided on the ceramic sliding member of the type shown in FIG. 2.

Referring next to the fragmentary enlarged schematic view in FIG. 3, there will be described in detail the construction of the ceramic sliding member according to the principle of this invention. The dense sintered body of a ceramic material consisting essentially of metal oxide and/or silicate has minute pores or holes 6 open on the mechanically ground surface, as shown in FIG. 3 in an exaggerated way. These open pores or holes 6 are also present where the ground surface is subsequently chemically etched as explained above. However, it is to be understood that a substantive portion of the ground surface or chemically etched surface of the ceramic substrate used is flat and smooth. On the ground surface of the ceramic substrate, a thin intermediate film 7 is formed by pyrolysis of an organosilicon compound, and a pyrolytic carbon film 8 is then formed on the intermediate film 7. The pyrolytic carbon film 8 includes a plurality of parallel planes of carbon crystallites 12. For easy understanding of orientation of the carbon crystallites 12, the size of the crystallites as shown in FIG. 3 is purposely made comparatively large, with respect to the ceramic crystal grains 2 and grain boundary bonding portions 3. The actual size of the crystallites 12 in the plane parallel to the surface of the ceramic substrate is as small as 50 Angstroms or so, where the pyrolytic carbon film 8 is formed at the pyrolyzing temperature of 1000°–1200° C. The actual size of the crystallites 12 is less than one tenth of the size as shown in FIG. 3, if the size of the open pores 6 as shown and the thickness of the film 8 as shown represent the actual size and thickness.

The thickness of the pyrolytic carbon film 8 can be controlled by controlling the amount of the hydrocarbon gas to be introduced into the furnace, or the time duration of the introduction. While it is difficult to accurately measure the thickness of the film 8, the minimum thickness of the film 8 required to provide a sufficiently high degree of wear resistance was experimentally found to be about 0.03 µm, by calculation on the basis of the electrical resistance measured of the film 8. According to the Bell System Technical Journal, April 1951, p.293, the electrical resistance of a pyrolytic carbon film which has substantially complete parallel crystal orientation is 0.013 $\Omega$cm, which corresponds to the minimum thickness required of the film 8. To assure safe operation of the ceramic sliding member during its use involving as many as several hundred thousands of sliding actions and some wearing of the film 8, the minimum thickness required of the film 8 is considered to about 0.1 µm. On the other hand, the thickness of the film 8 larger than 2.0 µm will increase a risk of removal or separation of the film 8 due to a difference in the thermal expansion between carbon in the film 8 and the ceramic material of the substrate, and will also deteriorate the parallel orientation of the planes of the carbon crystallites with respect to the ground surface of the ceramic substrate. Accordingly, the pyrolytic carbon film 8 having a thickness larger than 2.0 µm tends to have a reduced wear resistance. In view of the pyrolyzing efficiency and the life expectancy of the film 8, it is generally preferable that the thickness of the film 8 be held within a range between 0.1 µm and 2.0 µm.

A sintered body of a ceramic material consisting essentially of metal oxide and/or silicate is widely used as the ceramic substrate of a ceramic sliding member adapted to be used for a water faucet or bibcock valve, since this sintered body has excellent formability and sinterability and is comparatively inexpensive. In the present embodiment wherein the pyrolytic carbon film 8 is formed on the intermediate film 7, the influence of the ceramic composition of the ceramic substrate on the wear resistance of the water faucet valve is not so large and is of an ancillary nature. However, the ceramic composition of the ceramic substrate still has a certain degree of influence of some significance on the structure and properties of the pyrolytic carbon film. In this respect, it is noted that the mechanically ground surface of the ceramic substrate even if it is chemically etched should assure the intended orientation of the pyrolytic carbon crystallites. To this end, it is not desirable to use an excessively large amount of silicate glass as a component of the ceramic composition of the ceramic substrate. An experiment conducted by the present inventors indicated that the use of a ceramic composition wherein minute crystals of alumina ($Al_2O_3$) or zircon ($ZrO_2.SiO_2$) are bonded together by a small amount of silicate glass provided the most preferred sintered ceramic substrate.

To further clarify the present invention, there will be described a process of fabricating the ceramic sliding member adapted to be used in a water faucet valve according to one embodiment of the invention, and the performance of the sliding member as compared with those of known ceramic sliding members. However, it is to be understood that the present invention is not limited to the details of the illustrated embodiment, and may be otherwise embodied with various changes, modifications and improvements, which may occur to those skilled in the art, without departing from the spirit of the invention, which will be apparent from the foregoing and the following descriptions.

Figure 4:
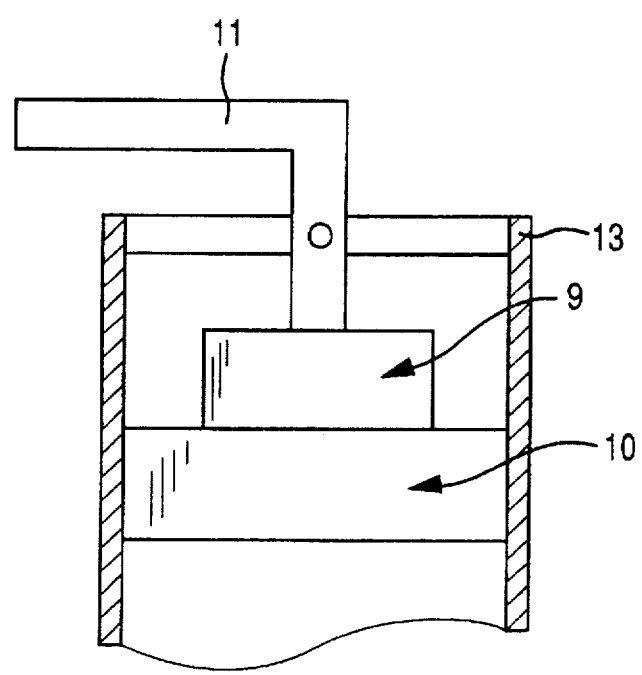
FIG. 4 is a fragmentary view in cross section of one example of a water faucet valve in which ceramic sliding members according to the present invention are used.

Reference is first made to FIG. 4, there is shown one example of a water faucet valve, which includes a rotary member 9 which is connected to an operating knob 11 and which is slidably rotatably disposed on a stationary distributor member 10. The stationary distributor member 10 is fixed in a conduit 13, so as to divide the conduit into two sections. The rotary member 9 is disposed in one of the two sections of the conduit 13, and cooperates with the stationary distributor member 10 to selectively permit and inhibit a water flow between the two sections of the conduit 13. Namely, the rotary member 9 and the distributor member 10 have water communication apertures, so that the water flow through the two members 9, 10 is normally inhibited. A rotary movement of the rotary member 9 by the operating knob 11 by a suitable angle will cause the water communication apertures to be aligned with each other, thereby permitting the water flow through the two members 9, 10. These rotary and stationary members 9, 10 were fabricated as the ceramic sliding members according to the present invention. The ceramic substrate of these sliding members 9, 10 is a dense alumina body which was prepared by firing a formed mass of a mixture consisting of powdered alumina and about 10% by weight of powdered silicate, at about 1600° C. in air. The thus prepared sintered body includes crystal grains of alumina having a particle size of about 1–5 µm which are bonded together by silicate glass.

The surface of the sintered alumina substrate which corresponds to the contacting surfaces of the rotary and stationary members 9, 10 was ground and smoothed by a diamond paste. Then, the thus ground surface of the alumina substrate was subjected to chemical etching with an aqueous solution of hydrofluoric acid of 1% concentration, so that only the glass phase near the surface of the substrate was removed, and as a result the minute holes or pores 6 defined primarily by the alumina grains 2 were formed as shown in FIG. 3. The etching depth or the depth of the pores 6 was suitably adjusted within a range of 0.1–1 µm. This adjustment can be made by controlling the concentration of the hydrofluoric acid solution and the etching time.

The alumina substrate whose surface has been mechanically ground and chemically etched was sufficiently washed with water and dried, and was then introduced into an evacuated electric furnace. While the interior of the furnace was held at about 900° C. and at a reduced pressure, a predetermined amount of a silicone oil as the organosilicon compound was injected into the furnace, so that the intermediate film 7 including carbon and silicon was formed on the ground and etched surface of the alumina substrate, by pyrolysis of the silicone oil, as indicated in FIG. 3. In practice, a batch of alumina substrates subjected to the preliminary treatment described above was introduced into the furnace. The amount of the intermediate film 7 deposited on each alumina substrate is determined by the ratio of the injected amount of the silicone oil to the total mass of the alumina substrates introduced in the furnace. Generally, the amount of the intermediate film 7 is selected to be approximately equal to a half that of the pyrolytic carbon film 8 to be subsequently formed. In the present specific example, the silicone oil was continuously injected into the furnace for about three minutes and then the interior of the furnace was kept at the predetermined pyrolyzing temperature for 15 minutes, during which the intermediate film 7 including carbon and silicon was formed from the product produced by the pyrolysis of the silicone oil, on the ground and etched surface of the alumina substrate.

The furnace temperature was then raised up to 1050° C., and benzine was injected as hydrocarbon into the furnace, so as to be directed to the intermediate film 7, so that the pyrolytic carbon film 8 was formed on the intermediate film 7, by pyrolysis of benzine. In the present example, benzine for the pyrolytic carbon film 8 was continuously injected into the furnace for about six minutes, in an amount twice as much as that of silicone oil injected for the intermediate film 7, so that the pyrolytic carbon film 8 formed had a thickness of about 0.3 µm. Like an ordinary pyrolytic carbon film, the pyrolytic carbon film 8 thus formed according to the present invention was electrically conductive. However, the present pyrolytic carbon film 8 had an increased degree of silver glossiness, and exhibited improved parallel orientation of the carbon crystallites 12, which contributes to a considerable increase in the strength and wear resistance.

Thus, an alumina sliding member having the pyrolytic carbon film 8 formed on the intermediate film 7 was fabricated. A test was conducted to check the present alumina sliding member for its sliding performance as the rotary and stationary members 9, 10 of the water faucet valve shown in FIG. 4, as compared with three known types of alumina sliding members having different sliding surface structures. Test results are indicated in the graphs of FIGS. 5, 6, 7 and 8, which will be described. In the test, the rotary member 9 was slidably rotated on the stationary distributor member 10, by repeated operation of the knob 11 in a cyclic manner. One cycle of sliding operation of the rotary member 9 or knob 11 consists of the following actions in the order of description: movement from hot-water stop position to hot-water delivery position; movement from the hot-water delivery position to cold-water stop position; movement from the cold-water stop position to cold-water delivery position; movement from the cold-water delivery position to the hot-water delivery position; and movement from the hot-water delivery position to the hot-water stop position. The sliding resistance of the rotary and stationary members 9, 10 is represented by a torque necessary to rotate the rotary member 9 slidably on the stationary member 10. The torque values were measured at selected points of time during the cyclic sliding test, that is, when the number of sliding cycles reached selected values. The graphs of FIGS. 5-8 indicate the torque values measured upon movements of the rotary member 9 to the hot-water delivery position and the cold-water delivery position, in relation to the number of the sliding cycles performed. The graphs show that the measured torque values generally increase with an increase in the number of the sliding cycles.

Figure 7:
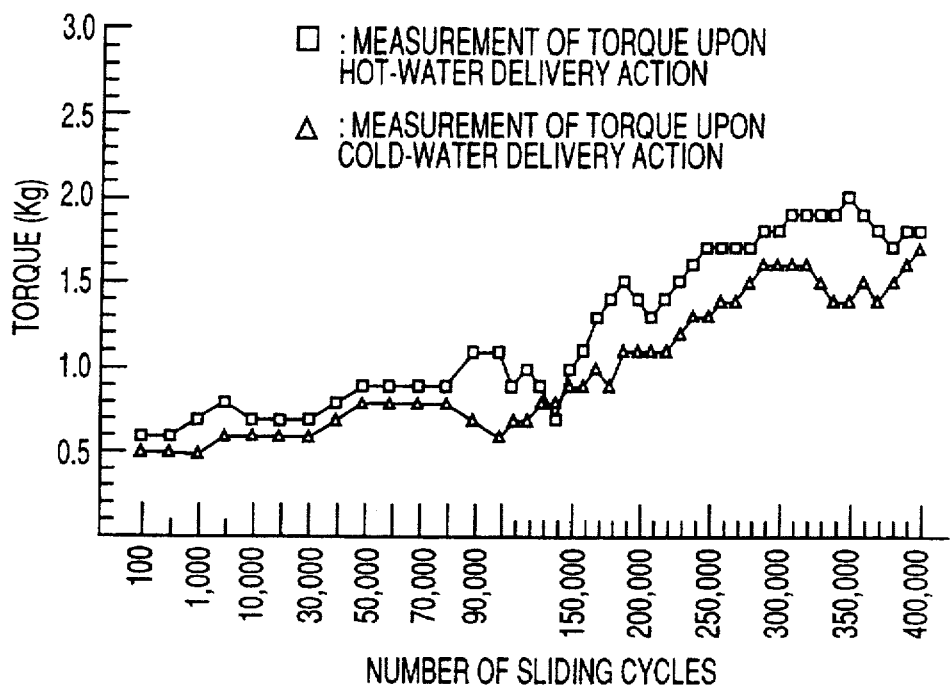
FIG. 7 is a graph indicating a relationship corresponding to that of FIG. 5, of a known alumina sliding member which is coated with a pyrolytic carbon film formed on an alumina substrate after etching of the substrate surface by hydrofluoric acid and which is not lubricated with a grease.
Figure 8:
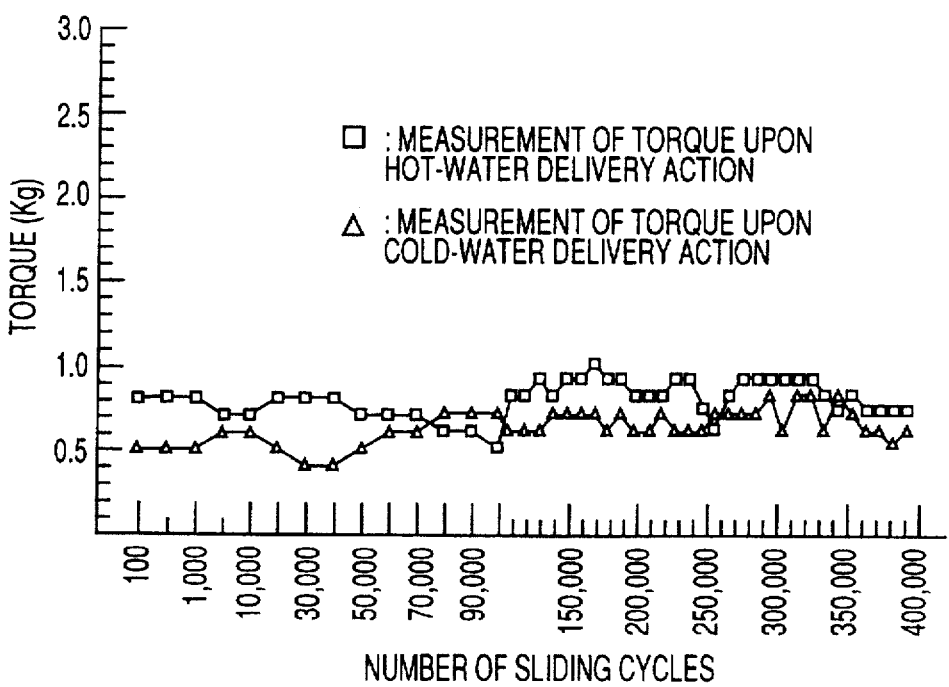
FIG. 8 is a graph indicating a relationship corresponding to that of FIG. 5, of a ceramic sliding member according to the present invention, which has a pyrolytic carbon film formed on an intermediate film formed on an alumina substrate by pyrolysis of an organosilicon compound.

The graph of FIG. 5 shows the test result of a comparative alumina sliding member (used as the members 9, 10) which is not provided with any wear-resistant film and is not lubricated with a grease. The graph of FIG. 6 shows the test result of a comparative alumina sliding member which is not provided with any wear-resistant film and is lubricated with a grease. The graph of FIG. 7 shows the test result of a comparative alumina sliding which is coated with a pyrolytic carbon film formed by pyrolysis on a surface of an alumina substrate which has been etched by hydrofluoric acid. The graph of FIG. 8 shows the test result of the alumina sliding member according to the present invention, which has the pyrolytic carbon film 8 formed on the intermediate film 7 formed on the alumina substrate surface by pyrolysis of an organosilicon compound as explained above in detail.

It will be understood from the graph of FIG. 5 that the known alumina sliding member which is not provided with any wear-resistant film and is not lubricated with a grease suffered from sticking (of the rotary member 9 to the stationary member 10) or "linking" (of the two members 9, 10 together) due to an excessive increase in the sliding resistance (torque required for sliding movement), before or when the number of the sliding cycles reached about 100,000. It will also be understood from the graph of FIG. 6 that the known alumina sliding member which is not provided with any wear-resistant film but is lubricated with a grease failed to operate (was not able to slide on the mating member) due to an eventual increase of the sliding resistance when the number of the sliding cycles reached about 200,000 to 250,000. It will also be understood from the graph of FIG. 7 that the known alumina sliding member which is coated with a pyrolytic carbon film formed by pyrolysis on the alumina substrate surface etched by hydrofluoric acid did not suffer from an excessive increase in the sliding resistance, before the number of the sliding cycles reached about 150,000. However, the sliding resistance of this known alumina sliding member of FIG. 7 increased from the initial value of 0.5 kg (as represented by the torque value) up to as high as 1.5 kg, at which the user of the water faucet valve feels considerable difficulty in operating the knob 11. On the other hand, the alumina sliding member according to the present invention maintained the sliding resistance at a level as low as about 1 kg, throughout the sliding test period which ended with 400,000 cycles, as indicated in the graph of FIG. 8. Thus, the test confirmed consistently low sliding resistance of the present alumina sliding member for a prolonged period of time.

While the present invention has been described in detail in its presently preferred form, it is to be understood that the invention is not confined to the details of the illustrated embodiment or example, but may be embodied with suitable changes, modifications and improvements, which may occur to artisans skilled in the art concerned, in the light of the foregoing disclosure, without departing from the spirit and scope defined in the appended claims.

It will be understood from the foregoing description that the ceramic sliding member according to the principle of this invention is characterized by a double-layered structure consisting of the intermediate film which is formed by pyrolysis on the mechanically ground surface of the ceramic substrate and which includes carbon and silicon, and the pyrolytic carbon film which is formed on the intermediate film and which has a graphite-like layered structure. The pyrolytic carbon film which functions as the sliding surface of the sliding member is tightly secured through the intermediate film to the ceramic substrate which consists essentially of metal oxide and/or silicate. Further, the provision of the intermediate film permits a high degree of parallelism of the planes of the pyrolytic carbon crystallites to the surface of the ceramic substrate surface. Accordingly, the pyrolytic carbon film, which is comparatively economical to fabricate, is given an appreciably increased wear resistance owing to excellent orientation of the pyrolytic carbon crystallites. Thus, the present ceramic sliding member is capable of maintaining sufficiently low sliding resistance for a comparatively long period of use, without using an exclusive lubricant such as a grease, and without employing a relatively expensive wear-resistant material such as silicon carbide, amorphous diamond or diamond-like carbon (DLC) as used in the prior art. The present invention therefore has technical and industrial significance.

What is claimed is:

1. A ceramic sliding member comprising:
   a ceramic substrate consisting of a dense sintered body of a ceramic material consisting essentially of metal oxide and/or silicate, said ceramic substrate having a mechanically ground surface;
   an intermediate film formed directly on said mechanically ground surface of said ceramic substrate, said intermediate film being formed from a product produced by pyrolysis of an organosilicon compound, and comprising carbon and silicon; and
   a pyrolytic carbon film formed on said intermediate film, said pyrolytic carbon film being produced by pyrolysis of hydrocarbon and having a graphite-like layered structure and a hexagonal crystal system having the $sp^2$ hybridized orbital, said pyrolytic carbon film serving as a sliding surface of said ceramic sliding member.

2. A ceramic sliding member according to claim 1, wherein said intermediate film is formed from a product produced by pyrolysis of silicone oil.

3. A ceramic sliding member according to claim 1, wherein said pyrolytic carbon film has a thickness of 0.1–2.0 μm.

4. A ceramic sliding member according to claim 1, wherein said dense sintered body consists essentially of alumina or zircon.

* * * * *